(12) United States Patent
Yamaguchi

(10) Patent No.: US 12,356,722 B2
(45) Date of Patent: Jul. 8, 2025

(54) MANUFACTURING METHOD OF AN OXIDE SEMICONDUCTOR DEVICE

(71) Applicant: Japan Display Inc., Tokyo (JP)

(72) Inventor: Yohei Yamaguchi, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/508,490

(22) Filed: Nov. 14, 2023

(65) Prior Publication Data

US 2024/0088161 A1    Mar. 14, 2024

Related U.S. Application Data

(63) Continuation of application No. 17/831,747, filed on Jun. 3, 2022, now Pat. No. 11,855,102, which is a (Continued)

(30) Foreign Application Priority Data

Mar. 29, 2017   (JP) ................... 2017-064920

(51) Int. Cl.
*H01L 27/12*    (2006.01)
*G02F 1/1333*   (2006.01)
(Continued)

(52) U.S. Cl.
CPC ....... *H10D 86/60* (2025.01); *G02F 1/133345* (2013.01); *G02F 1/1368* (2013.01);
(Continued)

(58) Field of Classification Search
CPC ... H01L 27/1225; H01L 27/12; H01L 27/124; H01L 27/1248; H01L 27/1251; H01L 29/41733; H01L 29/417; H01L 29/78618; H01L 29/458; H01L 29/786; H01L 29/7869; H01L 29/78648; H01L 29/78675; G02F 1/133345; G02F 1/1335; (Continued)

(56) References Cited

U.S. PATENT DOCUMENTS 10,373,984 B2   8/2019  Yamaguchi
11,355,520 B2   6/2022  Yamaguchi
(Continued)

FOREIGN PATENT DOCUMENTS

JP    2012015436 A   1/2012
JP     201592638 A   5/2015
WO    2010041686     4/2010

*Primary Examiner* — Nikolay K Yushin
(74) *Attorney, Agent, or Firm* — Maier & Maier, PLLC

(57) ABSTRACT

The purpose of the present invention is to improve reliability of the TFT of the oxide semiconductor. The feature of the invention is: A display device comprising: a substrate including a display area where plural pixels are formed, the pixel includes a first TFT of a first oxide semiconductor, a first gate insulating film is formed under the first oxide semiconductor, a first gate electrode is formed under the first gate insulating film, an interlayer insulating film is formed on the first oxide semiconductor; a drain wiring, which connects with the first oxide semiconductor, and a source wiring, which connects with the first oxide semiconductor, are formed on the interlayer insulating film; the drain wiring or the source wiring is a laminated structure of a second oxide semiconductor and a first metal, the second oxide semiconductor is under the first metal.

16 Claims, 16 Drawing Sheets

Related U.S. Application Data continuation of application No. 17/015,385, filed on Sep. 9, 2020, now Pat. No. 11,355,520, which is a continuation of application No. 16/446,481, filed on Jun. 19, 2019, now Pat. No. 10,804,297, which is a continuation of application No. 15/895,139, filed on Feb. 13, 2018, now Pat. No. 10,373,984.

(51) Int. Cl.
| | | |
|---|---|---|
| *G02F 1/1368* | (2006.01) | |
| *H10D 30/67* | (2025.01) | |
| *H10D 86/40* | (2025.01) | |
| *H10D 86/60* | (2025.01) | |
| *G02F 1/1343* | (2006.01) | |
| *G02F 1/1362* | (2006.01) | |
| *H10K 59/121* | (2023.01) | |
| *H10K 102/00* | (2023.01) | |

(52) U.S. Cl.
CPC ..... *H10D 30/6713* (2025.01); *H10D 30/6729* (2025.01); *H10D 30/6755* (2025.01); *H10D 86/423* (2025.01); *H10D 86/441* (2025.01); *H10D 86/451* (2025.01); *H10D 86/471* (2025.01); *G02F 1/134363* (2013.01); *G02F 1/136295* (2021.01); *G02F 1/13685* (2021.01); *G02F 2202/10* (2013.01); *G02F 2202/104* (2013.01); *H10D 30/6731* (2025.01); *H10D 30/6734* (2025.01); *H10D 30/6745* (2025.01); *H10K 59/1213* (2023.02); *H10K 2102/00* (2023.02)

(58) Field of Classification Search
CPC ........ G02F 1/1337; G02F 1/135; G02F 1/136; G02F 1/1333; G02F 1/136277; G02F 1/1368; G02F 1/134363; G02F 1/1343; G02F 1/136295; G02F 1/1362; G02F 1/13685; G02F 2202/10; G02F 2202/104; H10K 59/1213; H10K 59/121; H10K 59/1201; H10K 59/35; H10K 2102/00; H10D 86/60; H10D 86/423; H10D 86/40; H10D 86/441; H10D 86/451; H10D 86/471; H10D 30/6713; H10D 30/67; H10D 30/6729; H10D 30/6755; H10D 30/6731; H10D 30/6734; H10D 30/6745
See application file for complete search history.

(56) References Cited

U.S. PATENT DOCUMENTS

| | | |
|---|---|---|
| 2011/0156022 A1 | 6/2011 | Yamazaki et al. |
| 2012/0001167 A1 | 1/2012 | Morosawa |
| 2013/0240878 A1 | 9/2013 | Morosawa et al. |
| 2014/0042435 A1 | 2/2014 | Yamazaki |
| 2016/0276492 A1 | 9/2016 | Takeda et al. |
| 2017/0309649 A1 | 10/2017 | Hayashi |
| 2018/0122835 A1 | 5/2018 | Watakabe et al. |

MANUFACTURING METHOD OF AN OXIDE SEMICONDUCTOR DEVICE

CROSS-REFERENCE TO RELATED APPLICATIONS

The present application is a continuation of and claims benefit under 35 U.S.C. § 120 to U.S. application Ser. No. 17/831,747, filed Jun. 2, 2022, which is a continuation of and claims benefit under 35 U.S.C. § 120 to U.S. application Ser. No. 17/015,385, filed Sep. 9, 2020 (now U.S. Pat. No. 11,355,520), which is a continuation of and claims benefit under 35 U.S.C. § 120 to U.S. application Ser. No. 16/446,481, filed Jun. 19, 2019 (now U.S. Pat. No. 10,804,297), which is a continuation of and claims benefit under 35 U.S.C. § 120 to U.S. application Ser. No. 15/895,139, filed on Feb. 13, 2018 (now U.S. Pat. No. 10,373,984), and claims the benefit of priority under 35 U.S.C. § 119 to Japanese Patent Application JP 2017-064920, filed on Mar. 29, 2017, the contents of each of which are hereby incorporated by reference into this application.

BACKGROUND OF THE INVENTION

(1) Field of the Invention

The present invention relates to a display device comprising TFTs (Thin Film Transistor) that use oxide semiconductors.

(2) Description of the Related Art

A liquid crystal display device or an organic EL display device uses TFTs for switching elements in the pixels or for the built in driving circuits. The TFT uses either one of a a-Si (amorphous Silicon), poly-Si (poly Silicon) or oxide semiconductor as an active layer.

The a-Si has low mobility; consequently, there are some problems to use the a-Si in the TFTs for the peripheral driving circuits. The poly-Si has high mobility, which is suitable for the TFTs for the peripheral driving circuits; however, the poly-Si has some problems for the switching TFTs in the pixels since it has rather bigger leak current. The oxide semiconductor has low leak current and the mobility is higher than the mobility of the a-Si; however, it has some problems of reliability in controlling defects in the semiconductor layer.

The patent document 1 (Japanese patent laid open 2012-15436) discloses the structure that the entire of the TFT, which comprises the oxide semiconductor and gate electrode, is covered by the inorganic insulating film of e.g. aluminum oxide, titanium oxide or indium oxide.

The patent document 2 (Japanese patent laid open 2015-92638) discloses the structure to suppress the gate leak caused by the tunnel effect when the gate insulating film becomes thin in order to improve the characteristics of the TFT formed by the oxide semiconductor. The patent document 2 discloses to use the material of high dielectric constant as e.g. hafnium oxide, tantalum oxide laminated with silicon oxide, silicon nitride or aluminum oxide, etc. for the gate insulating film.

The patent document 3 (WO 2010/041686) discloses to sandwich the channel of the oxide semiconductor by the inorganic insulating film to stabilize the characteristics of the TFT formed by the oxide semiconductor. The patent document 3 discloses to use e.g. aluminum oxide, titanium oxide or indium oxide for the inorganic insulating film.

SUMMARY OF THE INVENTION

Examples of the oxide semiconductors are: IGZO (Indium Gallium Zinc Oxide), ITZO (Indium Tin Zinc Oxide), ZnON (Zinc Oxide Nitride), IGO (Indium Gallium Oxide), and so on. Since those semiconductors are transparent, they are sometimes called TAOS (Transparent Amorphous Oxide Semiconductor). By the way, for example, The ratio of the components of IGZO is generally In:Ga:Zn=1:1:1, however, in this specification, IGZO includes the one that deviated from the above ratio.

The initial characteristics of the TFT using the oxide semiconductor can be controlled by the amount of oxide in the oxide semiconductor or in the insulating film that contacts with the oxide semiconductor; however, controlling the reliability is difficult. Specific problem is that defects in the insulating layer increase when an amount of oxygen in the insulating layer is increased. Therefore, conventionally, the initial characteristics and the reliability have been in a relation of trade off.

Further, there has been a problem as that: even the amount of oxygen is controlled initially, the oxygen gradually moves out from the oxide semiconductor during the product life, consequently, the characteristics of the TFT change.

The purpose of the present invention is to realize the TFT formed by the oxide semiconductor that satisfies both of the initial characteristics and the high reliability during the product life.

The present invention solves the above problem; the concrete measures of the present inventions are as follows:

(1) A display device comprising: a substrate including a display area where plural pixels are formed, the pixel includes a first TFT of a first oxide semiconductor, a first gate insulating film is formed under the first oxide semiconductor, a first gate electrode is formed under the first gate insulating film, an interlayer insulating film is formed on the first oxide semiconductor; a drain wiring, which connects with the first oxide semiconductor, and a source wiring, which connects with the first oxide semiconductor, are formed on the interlayer insulating film, the drain wiring or the source wiring is a laminated structure of a second oxide semiconductor and a first metal, the second oxide semiconductor is under the first metal.

(2) A display device comprising: a substrate including a display area where plural pixels are formed, the pixel includes a first TFT of a first oxide semiconductor, a first gate insulating film is formed on the first oxide semiconductor, a first gate electrode is formed on the first gate insulating film, an interlayer insulating film is formed on the first gate electrode; a drain wiring, which connects with the first oxide semiconductor, and a source wiring, which connects with the first oxide semiconductor, are formed on the interlayer insulating film, the drain wiring or the source wiring is a laminated structure of a second oxide semiconductor and a first metal, the second oxide semiconductor is under the first metal.

DETAILED DESCRIPTION OF THE PREFERRED EMBODIMENTS

The present invention will be described in detail referring to the following embodiments.

First Embodiment

Figure 1:
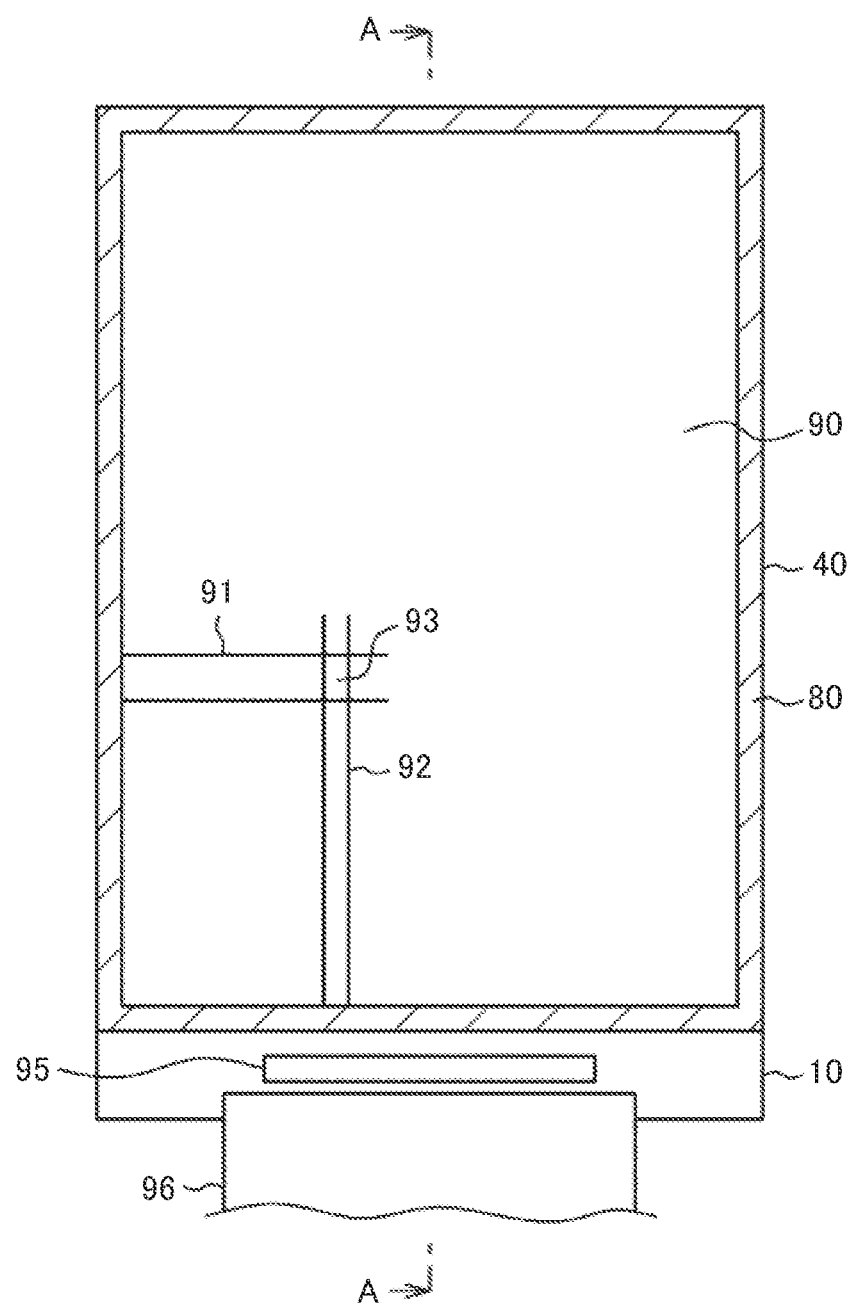
FIG. 1 is a plan view of a liquid crystal display device.

FIG. 1 is a plan view of a liquid crystal display device, which is used in e.g. the cellar phone, where the present invention is applied. In FIG. 1, the TFT substrate 10, in which plural pixels 93 are formed, and the counter substrate 40 are adhered by the seal material 80. The liquid crystal is sandwiched between the TFT substrate 10 and the counter substrate 40. The display area 90 is formed inside of the seal material 80. In the display area 90, the scan lines 91 extend in lateral direction and arranged in longitudinal direction; the video signal lines 92 extend in longitudinal direction and arranged in lateral direction The pixel 93 is formed in the area surrounded by the scan lines 91 and the video signal lines 92. In each of the pixels 93, the pixel electrode and the TFT, which controls the signals that are to be supplied to the pixel electrode, are formed. The TFT substrate 10 is made bigger than the counter substrate 40; the portion of the TFT substrate 10 that doesn't overlap with the counter substrate 40 is the terminal area. The driver IC 95 is installed in the terminal area; the flexible wiring substrate 96 is connected to the terminal area to supply signals and powers to the liquid crystal display device.

Figure 2:
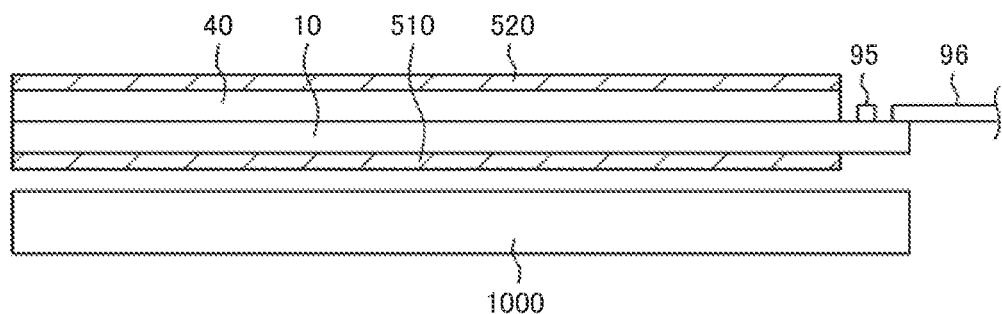
FIG. 2 is a cross sectional view, along the line A-A of FIG. 1.

FIG. 2 is cross sectional view along the line A-A of FIG. 1. In FIG. 2, the TFT substrate 10 and the counter substrate 40 are overlapped to each other. The liquid crystal layer is omitted in FIG. 2 since the thickness of the liquid crystal layer is much thinner than the thicknesses of the TFT substrate 10 and the counter substrate 40. The portion where the TFT substrate 10 and the counter substrate 40 don't overlap is the terminal area where the driver IC 95 is installed and the flexible wiring substrate 96 is connected.

Since the liquid crystal is not self-illuminant, the back light 1000 is set at the rear side of the TFT substrate 10. Images are formed by controlling the light from the back light 1000 in each of the pixels. Since the liquid crystal controls only the polarized light, the lower polarizing plate 510 is adhered to underneath the TFT substrate 10, and the upper polarizing plate 520 is adhered to on the counter substrate 40.

Figure 3:
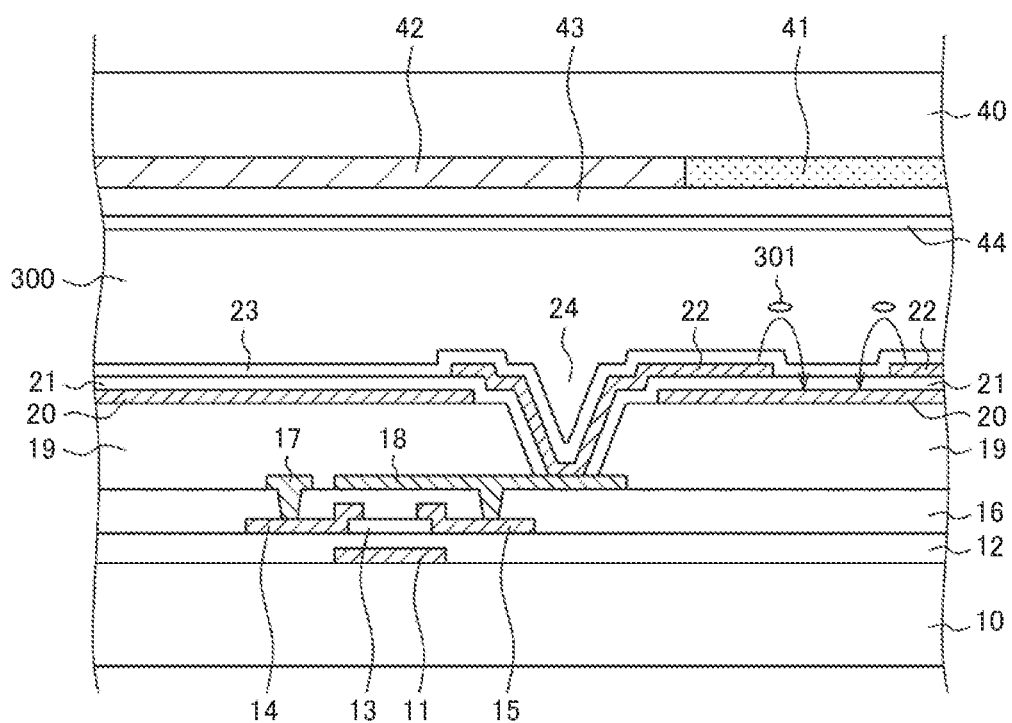
FIG. 3 is a cross sectional view of the display area of the liquid crystal display device of the first embodiment.

FIG. 3 is a cross sectional view of the display area 90 of the liquid crystal display device. In FIG. 3, the TFT substrate 10 is formed by glass or resin. The gate electrode 11 is formed on the TFT substrate 10. The gate electrode 11 is made by e.g. Mo, W or alloys of those metals. The gate insulating film 12 is formed covering the gate electrode 11. The gate insulating film 12 is formed by a silicon oxide (herein after may be called SiO) film or a laminated film of a silicon oxide film and a silicon nitride (herein after may be called SiN) film. When the laminated film is used as the gate insulating film 12, the silicon oxide film is located to contact with the first oxide semiconductor 13.

The first oxide semiconductor 13 of e.g. IGZO is formed on the gate insulating film 12. The drain electrode 14 is formed on one side of the oxide semiconductor 13; the source electrode 15 is formed on another side, opposing to the one side, of the oxide semiconductor 13. The drain electrode 14 and the source electrode 15 can be made of the same material as the gate electrode 11 or can be made of the same material as the video signal line 92. The oxide semiconductor 13 becomes conductive where the drain electrode 14 or the source electrode 15 contacts since the drain electrode 14 or the source electrode 15 absorbs oxygen from the oxide semiconductor 13.

The interlayer insulating film 16 is formed covering the first oxide semiconductor 13, the drain electrode 14 and the source electrode 15. The interlayer insulating film 16 is formed e.g. either by a silicon oxide film, a laminated film of a silicon oxide film and a silicon nitride film, or a laminated film of a silicon oxide film and an aluminum oxide (herein after may be called as AlO) film. If the laminated film is used, the SiO film is set to contact with the first oxide semiconductor 13.

Through holes are formed in the interlayer insulating film 16 to connect the drain electrode 14 and the drain wiring 17 at one through hole and to connect the source electrode 15 and the source wiring 18 at another thorough hole. As will be explained later, the feature of the present invention is to make each of the drain wiring 17 and the source wring 18 in a two layer structure; namely, the second oxide semiconductor layer is set as the lower layer and the metal is set as the upper layer. Thus, oxygen can be supplied to the first oxide semiconductor 13 that constitutes the TFT, easily.

The organic passivation film 19 is formed covering the interlayer insulating film 16, drain wiring 17 and the source wiring 18. The organic passivation film 19 is made as thick as 2 μm to 4 μm since it has also a role as a flattening film. The through hole 24 is formed in the organic passivation film 19 to connect the pixel electrode 22 and the source wiring 18, which connects with the source electrode 15 of the TFT.

The common electrode 20 is formed in a solid plane shape on the organic passivation film 19. The capacitive insulating film 21 of SiN is formed covering the common electrode 20; the pixel electrode 22 is formed on the capacitive insulating film 21. The capacitive insulating film 21 is so called because a holding capacitance is formed between the common electrode 20 and the pixel electrode 22 via the capacitive insulating film 21. The alignment film 23 is formed covering the pixel electrode 22 for an initial alignment of the liquid crystal molecules. The pixel electrode 22 is stripe shaped or comb shaped in a plan view. When the voltage is applied to the pixel electrode 22, the line of force as depicted by arrows in FIG. 3 is generated, whereby the liquid crystal molecules 301 are rotated, thus the transmittance of the light from the back light is controlled in a pixel.

In FIG. 3, the counter substrate 40 is set to sandwich the liquid crystal layer 300 with the TFT substrate 10. On the inner side of the counter substrate 40, the color filter 41 is formed corresponding to the pixel electrode 22 to form the color images. The black matrix 42 is formed between the color filters 41 to improve the contrast of the images. The overcoat film 43 is formed covering the color filter 41 and the black matrix 42. The overcoat film 43 prevents that the pigments in the color filter 41 goes out and contaminates the liquid crystal layer 300. The alignment film 44 is formed covering the overcoat film 43.

Figure 4:
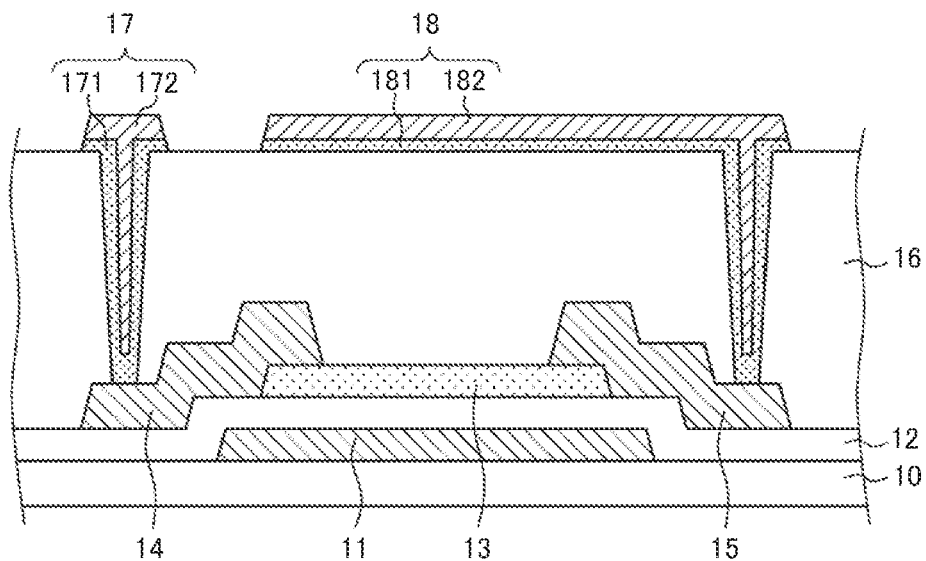
FIG. 4 is a cross sectional view of the first embodiment.

FIG. 4 is a cross sectional view of the first embodiment of the present invention. In FIG. 4, the gate electrode 11 made of metal is formed on the TFT substrate 10; the gate insulating film 12 is formed over the gate electrode 11. The gate insulating film 12 is made either by a SiO film or a laminated film of a SiO film and a SiN film. The first oxide semiconductor 13 made of e.g. IGZO, constituting the TFT, is formed on the gate insulating film 12. The thickness of the first oxide semiconductor 13 is 10 nm to 70 nm.

The drain electrode 14 is formed at one side of the first oxide semiconductor 13; the source electrode 15 is formed at another side of the first oxide semiconductor 13. Oxygen is extracted from the oxide semiconductor 13 where the drain electrode 14 or the source electrode 15 contacts, consequently, the oxide semiconductor 13 becomes conductive where the drain electrode 14 or the source electrode 15 contacts.

The interlayer insulating film 16 is formed covering the first oxide semiconductor 13, the drain electrode 14 and the source electrode 15. The interlayer insulating film 16 is formed e.g. either by a silicon oxide film, a laminated film of a silicon oxide film and another insulating film. Through holes are formed in the interlayer insulating film 16 to connect the drain electrode 14 and the drain wiring 17 at one through hole and to connect the source electrode 15 and the source wiring 18 at another thorough hole. The feature of the present invention is to make each of the drain wiring 17 and the source wring 18 in a two layer structure; namely, the second oxide semiconductor layers 171, 181 are set as the lower layers and the metals 172, 173 are set as the upper layers. The metals 172, 182 can be formed by the same material as the video signal line as e.g. laminated structure of Ti/Al alloy/Ti. The thicknesses of the second oxide semiconductors 171, 181 are e.g. 1 nm to 30 nm.

A necessary amount of oxygen must be maintained in the first oxide semiconductor 13 to stabilize the characteristics of the TFT. If the oxygen is supplied from the SiO constituting the interlayer insulating film 16, the SiO must have many defects. If the SiO has a lot of defects, however, the defects absorb several gases during the manufacturing processes. The absorbed gases are discharged during the life time of the product, and absorbed by the first oxide semiconductor 13; consequently, the characteristics of the TFT become unstable.

In this invention, as described in FIG. 4, the drain wiring 17 and the source wiring 18 cover the TFT, which includes the first oxide semiconductor 13. Thanks to the structure, the oxygen can be easily supplied to the first oxide semiconductor 13 from the second oxide semiconductor 171, 181 through the interlayer insulating film 16. In addition, the oxygen is easily confined in the interlayer insulating film 16 or in the layers under the interlayer insulating film 16. As a result, the amount of oxygen is stably maintained in the first oxide semiconductor 13 without increasing defects in the interlayer insulating film 16. In the meantime, in an example of FIG. 4, both of the drain wiring 17 and source wiring 18 are made two layer structures; it is possible to make either one of the drain wiring 17 and source wiring 18, which covers more area of the first semiconductor 13, can be made two layer structure.

Figure 5:
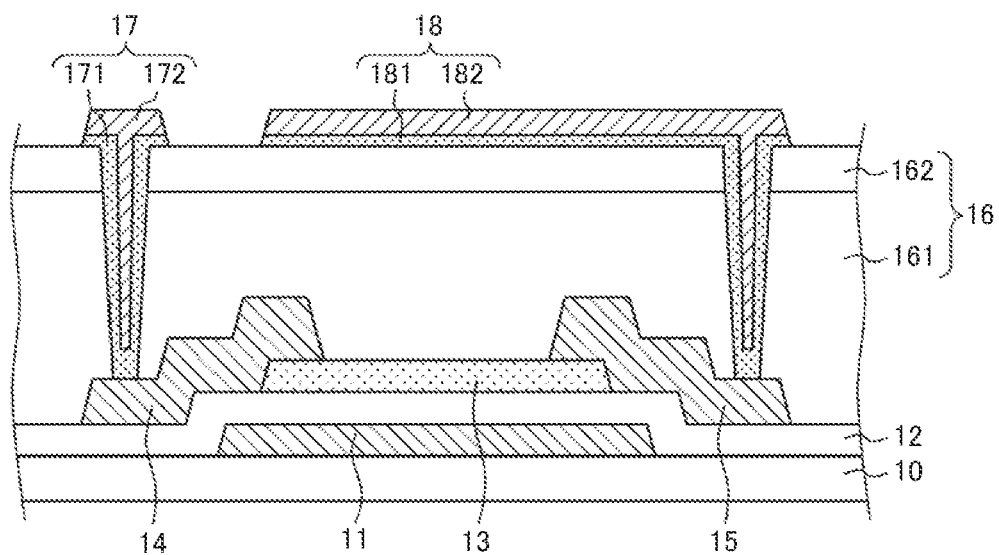
FIG. 5 is a cross sectional view of the second example of the first embodiment.

FIG. 5 is an example that the interlayer insulating film 16 is made by two layers of the silicon oxide film 161 and the aluminum oxide film 162. In this structure, the aluminum oxide 162, too, can be a source of oxygen; in addition, the aluminum oxide 162 can have a role to confine the oxygen at the side of the first oxide semiconductor 13. Further, the aluminum oxide has a good blocking structure, thus, it prevents moisture from intruding in the first oxide semiconductor 13.

Figure 6:
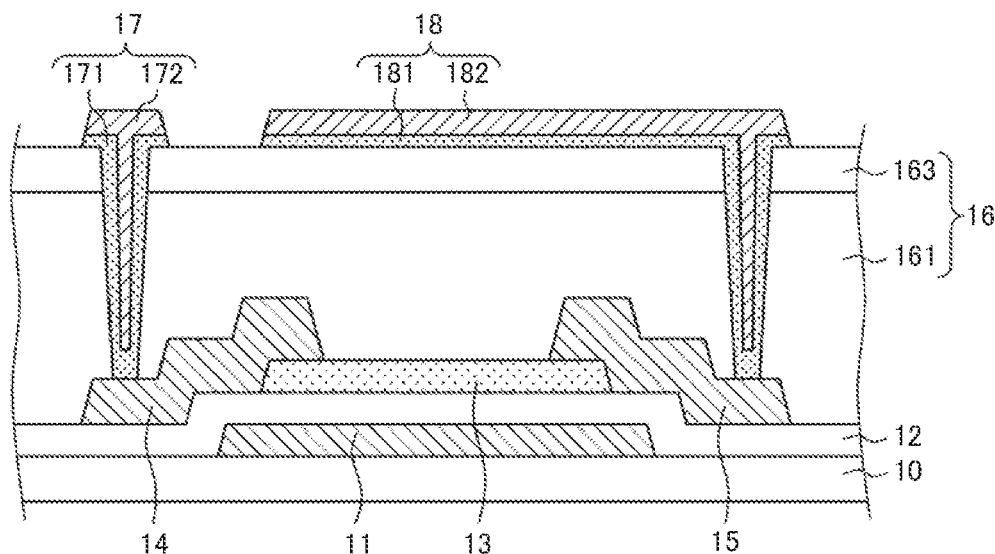
FIG. 6 is a cross sectional view of the third example of the first embodiment.

FIG. 6 is an example that the interlayer insulating film 16 is made by two layers of the silicon oxide film 161 and the silicon nitride film 163. In this structure, the silicon oxide film 161 contacts with the first oxide semiconductor 13; the silicon nitride film 163 contacts with the second oxide semiconductors 171, 181. The silicon nitride film 163 is a superior blocker against the moisture. Consequently, the two layer structure of the silicon oxide film 161 and the silicon nitride film 163 makes a superior blocker against impurities. Further this structure has a merit in manufacturing process that the silicon oxide film 161 and the silicon nitride film 163 are continuously formed by CVD (Chemical Vapor Deposition).

The silicon nitride film 163, however, discharges hydrogen, it deteriorate the oxide semiconductor 13, which constitutes TFT. In the structure of FIG. 6, the hydrogen from the silicon nitride film 163 is absorbed by the second oxide semiconductors 171, 181, which are under layers of the drain wring 17 and the source wiring 18; thus, the influence of the hydrogen to the first oxide semiconductor 13, which constitutes the TFT, is suppressed; consequently, the characteristics of the TFT can be stabilized.

Figure 7:
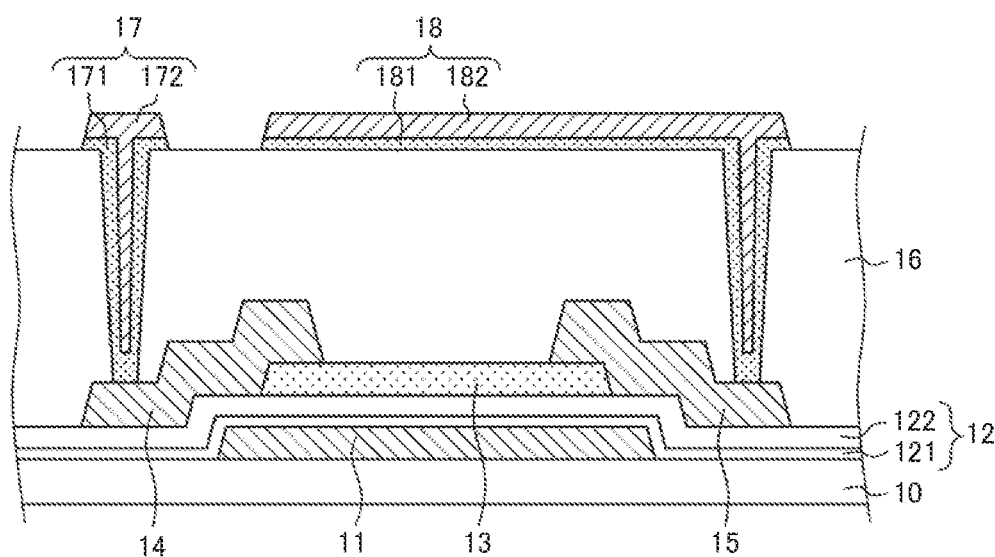
FIG. 7 is a cross sectional view of the fourth example of the first embodiment.

FIG. 7 is a cross sectional view that shows another example of the first embodiment. FIG. 7 differs from FIG. 4 in that the gate insulating film 12 is formed by two layers of the lower layer 121 and the upper layer 122. The lower layer 121 is made of AlO. The upper layer 122 is formed by SiO or a laminated film of SiO and SiN. In this case, too, the SiO film contacts with the first oxide semiconductor 13.

According to the structure of FIG. 7, oxygen can be supplied to the first oxide semiconductor 13 from AlO, which constitutes the lower layer 121 of the gate insulating film 12. At the same time, the AlO layer prevents that the gate electrode 11, which is made of metal, absorbs oxygen from the first oxide semiconductor 13 through the gate insulating film 12. Therefore, the first oxide semiconductor 13 can maintain enough oxygen without making many defects in the SiO, which constitutes the gate insulating film 12.

Figure 8:
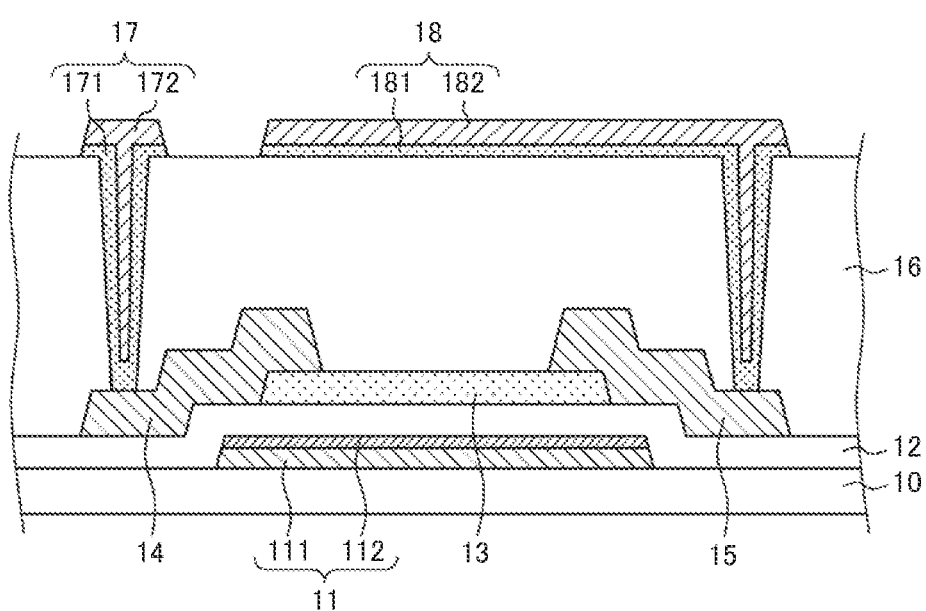
FIG. 8 is a cross sectional view of the fifth example of the first embodiment.

FIG. 8 is cross sectional view that shows yet another example of the first embodiment. FIG. 8 differs from FIG. 4 in that the gate electrode 11 is formed by two layers of the lower layer 111 and the upper layer 112. In FIG. 8, the upper layer 112 is formed by a third oxide semiconductor. The thickness of the third oxide semiconductor 112 is 1 nm to 30 nm. The third oxide semiconductor 112 prevents that the gate electrode 11 absorbs the oxygen from the first oxide semiconductor 13; further, the third oxide semiconductor 112 supplies oxygen to the first oxide semiconductor 13. Therefore, the first oxide semiconductor 13 can maintain enough oxygen without making many defects in the SiO film that constitutes the gate insulating film 12.

The structures of FIGS. 7 and 8 can coexist. In addition, structures of FIGS. 4-8 are combinable arbitrarily. Thus, the effect of the invention can be further intensified.

Second Embodiment

Since Poly-Si has a high mobility, a high speed TFT can be realized. On the other hand, the oxide semiconductor has low leak current; thus, the TFT that uses the oxide semiconductor is suitable to the switching element. Therefore, using both of the TFT of the Poly-Si and the TFT of the oxide semiconductor can realize a high performance display device. One example is that the TFT of the Poly-Si is used for the driving circuit while the TFT of the oxide semiconductor is used for the switching element in a pixel.

Figure 9:
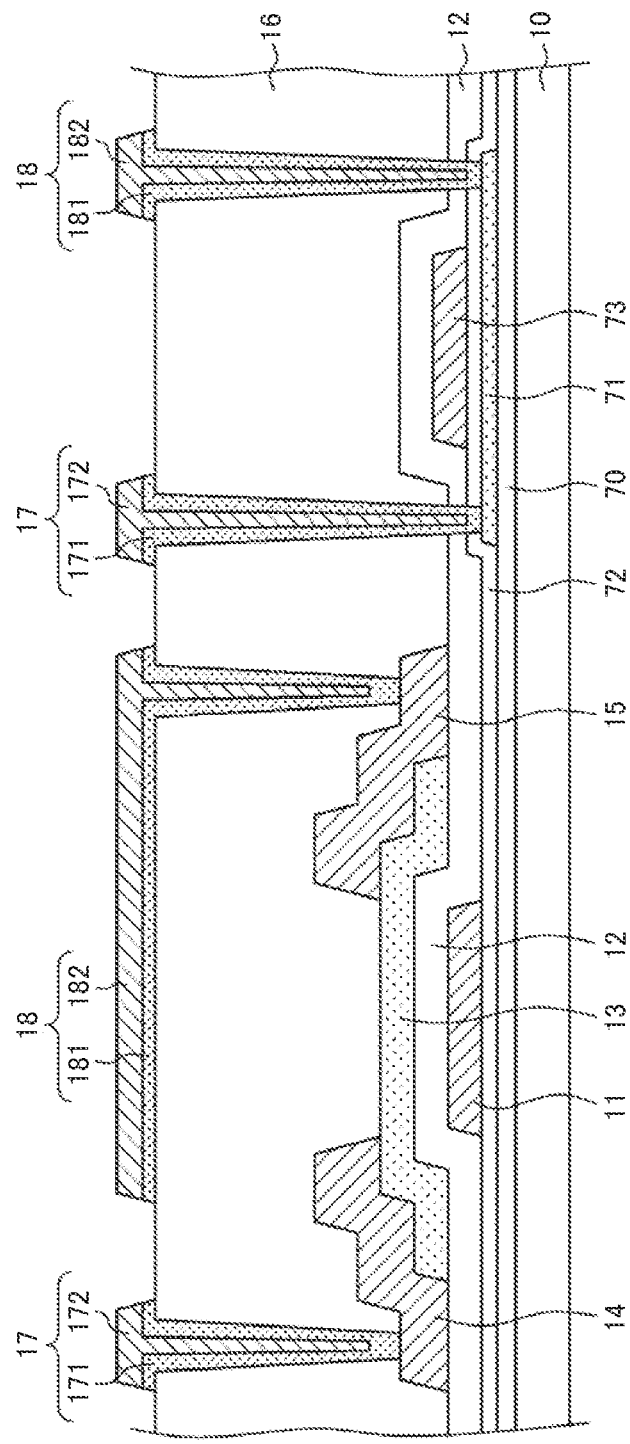
FIG. 9 is a cross sectional view of the second embodiment.

FIG. 9 is a cross sectional view of the second embodiment of the present invention where the TFT of Poly-Si and the TFT of the oxide semiconductor 13 coexist. Such a structure is called a hybrid structure. The TFT of the oxide semiconductor in FIG. 9 is the same as the structure of FIG. 4. The gate electrode 11 is, however, formed on the silicon oxide film 72, formed by CVD using TEOS (Tetraethyl orthosilicate) as the material, which works as a gate insulating film for the Poly-Si TFT.

In FIG. 9, the undercoat 70 is formed on the TFT substrate 10. The structure of the undercoat 70 is e.g. a laminated film of SiO/SiN. The undercoat prevents that the poly-Si 71 is contaminated by impurities from the TFT substrate, which is formed by glass or resin. The SiO film is superior in adhering with the substrate 10 while SiN is superior in blocking the moisture.

In FIG. 9, the Poly-Si 71 is formed on the undercoat 70. Poly-Si is formed as that: initially, a-Si is formed; then, excimer laser is applied on the a-Si to transform it to Poly-Si; after that, the poly-Si 71 is patterned. The gate insulating film 72 is formed covering the Poly-Si 71. The gate insulating film 72 is formed by CVD using TEOS as the material.

The gate electrode 73 for the TFT of the Poly-Si is formed on the gate insulating film 72. The gate electrode 11 for TFT of the oxide semiconductor 13 is formed at the same time. The gate insulating film 12 is formed covering the gate electrodes 11 and 73. The processes after that are the same as the processes explained for the TFT of the oxide semiconductor in FIG. 4. The drain wiring 17 and the source wiring 18 for the TFT of the oxide semiconductor 13 and the TFT of the Poly-Si 71 are formed simultaneously, and the through holes for the drain wiring 17 and the source wiring 18 are formed simultaneously. Namely, the drain wiring 17 and the source wiring 18 at the TFT of the Poly-Si 71 are two layer structures of the second oxide semiconductor 171, 181 and the metal 172, 182. The second oxide semiconductor 171, 181 can be eliminated at the TFT of the Poly-Si.

The structure of FIG. 9 enables a stable production for the display devices that use the hybrid structure of high reliability that uses the TFT of the oxide semiconductor and the TFT of poly-Si.

Third Embodiment

Figure 10:
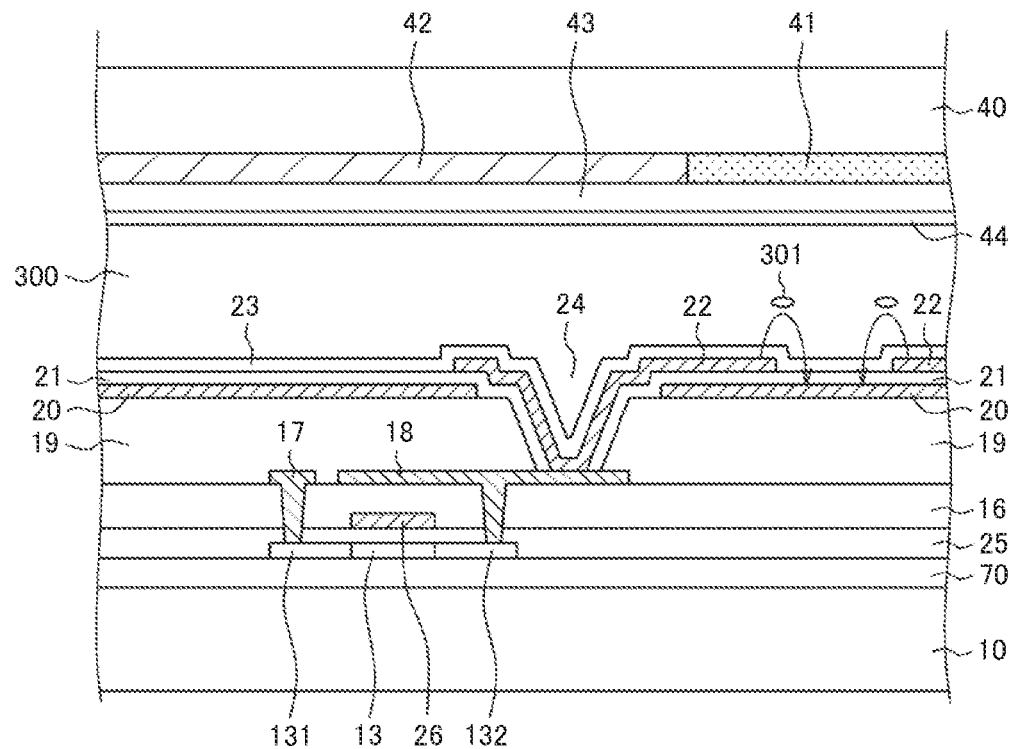
FIG. 10 is a cross sectional view of the display area of the liquid crystal display device of the third embodiment.

The first embodiment and the second embodiment are cases where the present invention is applied to the bottom gate type TFT of the oxide semiconductor; however, the present invention is applicable to the top gate type TFT, too. FIG. 10 is a cross sectional view of the display area of the liquid crystal display device that uses a top gate type TFT. In FIG. 10, the TFT substrate 10 is formed by glass or resin. The undercoat 70 is formed on the TFT substrate 10 so that the semiconductor layer is not contaminated by impurities from the glass or resin.

The undercoat 70 is the same as explained in FIG. 9; however, in this embodiment, the AlO layer may be applied in addition to a laminated film of the SiO film and the SiN film. When the AlO layer is laminated, the amount of oxygen in the first oxide semiconductor 13 can be maintained more stably.

In FIG. 10, the oxide semiconductor 13 of e.g. IGZO is formed on the undercoat 70. The gate insulating film 25 is formed covering the oxide semiconductor 13. In this invention, as will be explained later, the gate insulating film 25 is formed by SiO; however, the AlO film may be laminated on the SiO film. The gate electrode 26 is formed on the gate insulating film 25. The first example of the current embodiment, as explained later, may have a laminated structure of the third oxide semiconductor and the metal for the gate electrode 26.

In FIG. 10, after the gate electrode 26 is formed, an ion implantation is applied to the oxide semiconductor using the gate electrode 26 as a mask to form defects in the oxide semiconductor 13 for conductivity; thus, the drain region 131 and the source region 132 are formed in the oxide semiconductor 13. The interlayer insulating film 16 is formed covering the gate electrode 26 and the gate insulating film 25. The interlayer insulating film 16 is formed by SiO, SiN or AlO as explained in the first embodiment.

Through holes are formed in the interlayer insulating film 16 and the gate insulating film 25; subsequently, the drain wiring 17 and the source wiring 18 are formed. The drain wiring 17 connects with the video signal line 92 and the source wiring 18 connects with the pixel electrode 22 via through hole 24. As will be explained later, the drain wiring 17 and the source wiring 18 are laminated structures of the metal and the second oxide semiconductor.

The organic passivation film 19 is formed covering the drain wiring 17, the source wiring 18 and the interlayer insulating film 16. The layers above the organic insulating film 19 is the same as explained in FIG. 3, thus, the explanation is omitted.

Figure 11:
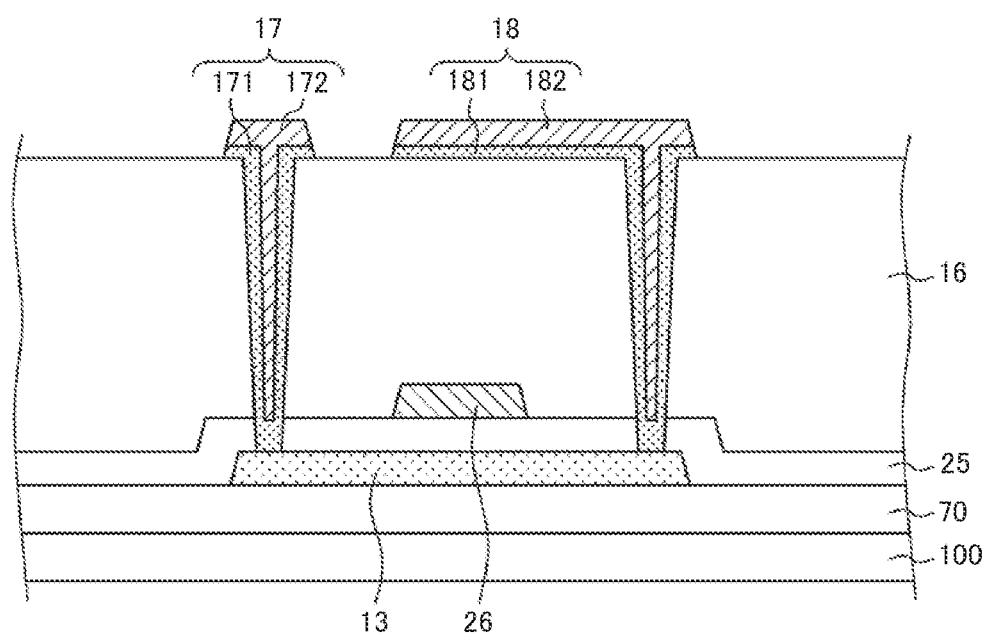
FIG. 11 is a cross sectional view of the third embodiment.

FIG. 11 is a cross sectional view that shows the feature of the third embodiment. In FIG. 11, the drain wiring 17 and source wiring 18 are laminated films of the second oxide semiconductors 171, 181 and the metals 172, 182. The thickness of the second oxide semiconductor 171, 181 is 1 nm to 30 nm. Thanks to the second oxide semiconductor 171, 181, oxygen is confined in the layer under the interlayer insulating film 16, and further, oxygen is supplied to the first oxide semiconductor 13 from the second oxide semiconductor 171, 181 through the interlayer insulating film 16. Thus, variation in characteristics in the TFT can be suppressed.

Figure 12:
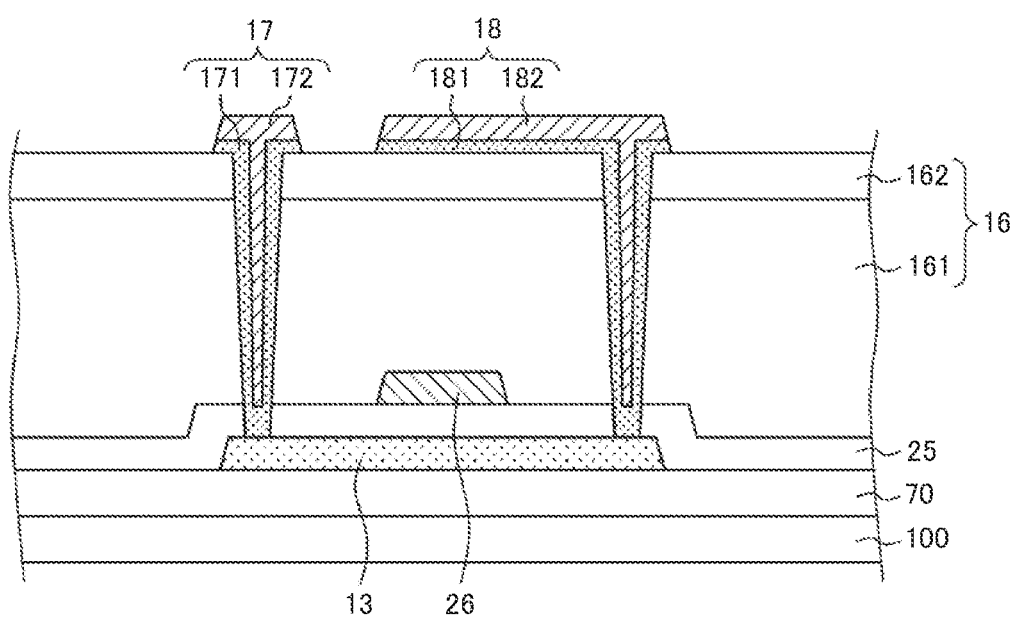
FIG. 12 is a cross sectional view of the second example of the third embodiment.

FIG. 12 is a cross sectional view that shows another example of the third embodiment. FIG. 12 differs from FIG. 11 in that the interlayer insulating film 16 is formed by two layer structure; the lower layer 161 is made of SiO and the upper layer 162 is made of the AlO. The thickness of the AlO film 162 is 1 nm to 50 nm. The AlO has superior characteristics in blocking oxygen, thus, oxygen can be confined in the side of the TFT more efficiently. In addition, the AlO can supply oxygen to the first oxide semiconductor 13, which constitutes the TFT.

Figure 13:
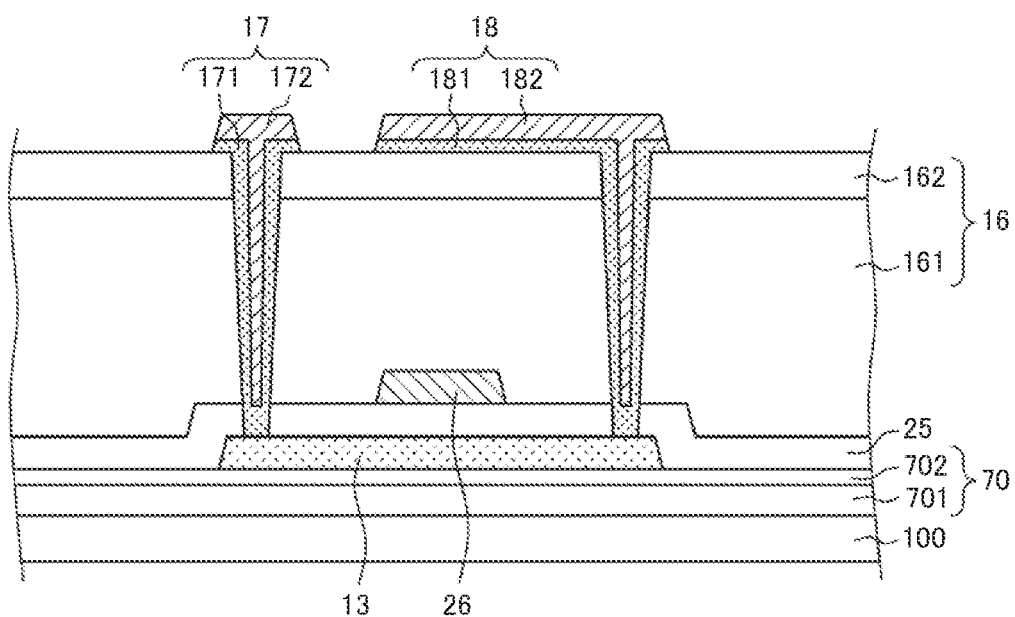
FIG. 13 is a cross sectional view of the third example of the third embodiment.

FIG. 13 is cross sectional view that shows yet another example of the second embodiment. FIG. 13 differs from FIG. 11 in that the undercoat 70 is formed by a two layer structure; wherein the lower film 701 is a SiO film or a laminated film of the SiO film and the SiN film, the upper film 702 is an AlO film. The AlO film contacts with the first oxide semiconductor 13 that constitutes the TFT. The thickness of the AlO film is 1 nm to 30 nm. FIG. 13 has an additional merit besides the merit of FIG. 11 that the AlO layer can efficiently supply oxygen to the first oxide semiconductor 13 since the AlO film directly contact with the first semiconductor 13.

Figure 14:
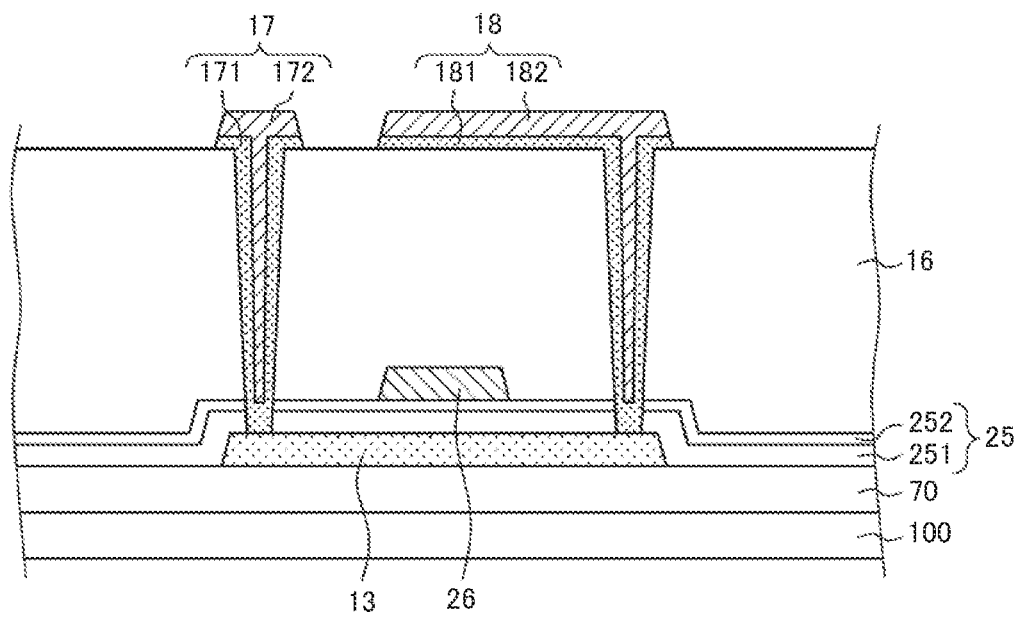
FIG. 14 is a cross sectional view of the fourth example of the third embodiment.

FIG. 14 is cross sectional view that shows yet another example of the second embodiment. FIG. 14 differs from FIG. 11 in that the gate insulating film 25 is a laminated layer of the lower layer 251 made of the SiO and the upper layer 252 made of the AlO. The lower layer 251 made of SiO contacts with the first oxide semiconductor 13 while the upper layer 252 made of the AlO contacts with the gate electrode 26.

The upper layer 252 made of the AlO layer is a source of oxygen for the first oxide semiconductor 13. Thus, enough oxygen can be supplied to the oxide semiconductor 13 without increasing defect density in the lower layer 251 made of the SiO. Further, the AlO is a superior blocker against oxygen; thus, oxygen can be confined efficiently inside of the oxide semiconductor 13. The structure of FIG. 14 has an above explained merit in addition to the merit in FIG. 11, thus, a reliability of the TFT including the oxide semiconductor 13 can be improved.

Figure 15:
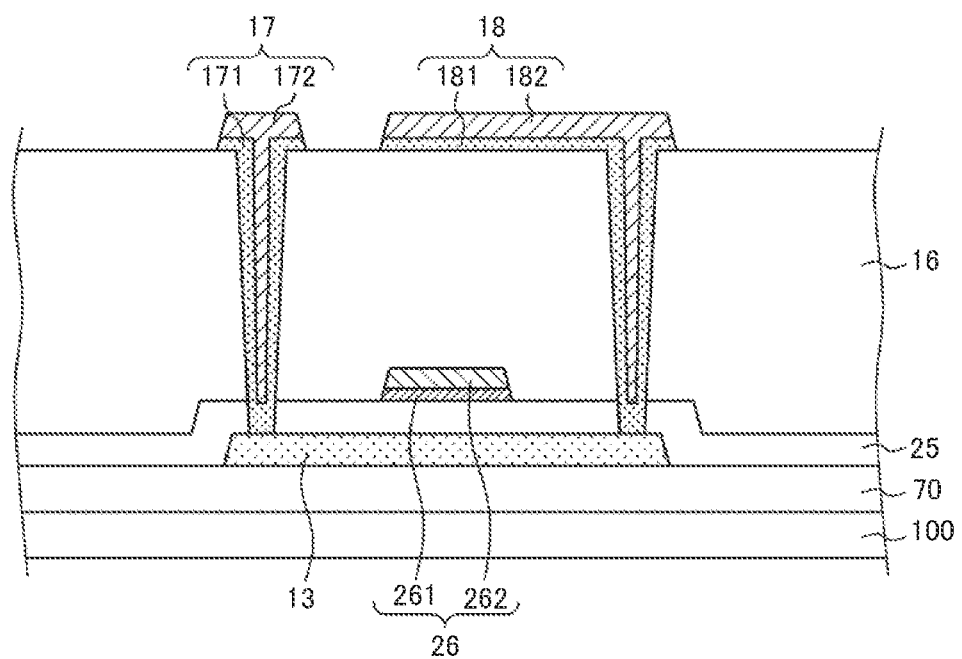
FIG. 15 is a cross sectional view of the fifth example of the third embodiment.

FIG. 15 is cross sectional view that shows yet another example of the second embodiment. FIG. 15 differs from FIG. 11 in that the gate electrode 26 is a laminated layer of the lower layer 261 made of the third oxide semiconductor and the upper layer 262 made of the metal. The third oxide semiconductor layer 261 is formed by e.g. IGZO. The third oxide semiconductor 261 can be a different material from the first oxide semiconductor 13 that constitutes the TFT; however, if the same material as the first oxide semiconductor 13 is used, the process can be simpler.

In FIG. 15, the third oxide semiconductor 261 contacts with the gate insulating film 25. The third oxide semiconductor 261 can supply oxygen to the first oxide semiconductor 13, which constitutes the TFT; thus, the variation in characteristics in the TFT can be suppressed. As described above, the structure of FIG. 15 has an above explained merit in addition to the merit in FIG. 11, thus, a reliability of the TFT including the oxide semiconductor 13 can be improved.

Figure 16:
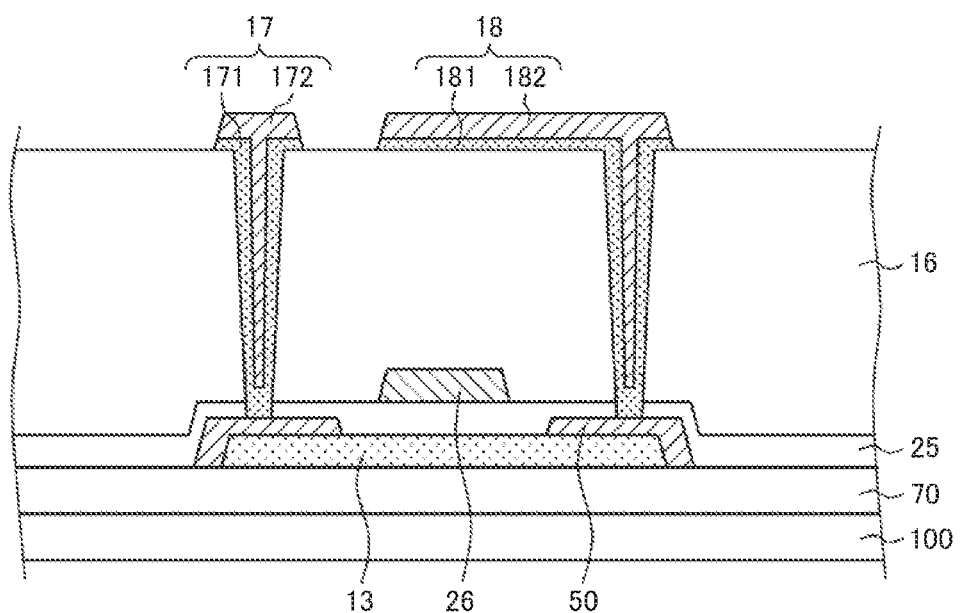
FIG. 16 is a cross sectional view of the sixth example of the third embodiment.

FIG. 16 is cross sectional view that shows yet another example of the second embodiment. FIG. 16 differs from FIG. 11 in that the protective layer 50 made of metal is formed on the first oxide semiconductor 13 at portions the drain wring 17 and the source wiring 18 connect with the first oxide semiconductor 13. The drain wiring 17 and the source wiring 18 are formed in the through holes formed in the interlayer insulating film 16 and the gate insulating film 25. The through holes are formed by e.g. dry etching. Since the oxide semiconductor film 13 is as thin as 10 nm to 70 nm, there is a danger that the oxide semiconductor 13 is eliminated simultaneously when the interlayer insulating film 16 and the gate insulating film 25 are etched.

In FIG. 16, the protective layers 50 are formed on the oxide semiconductor 13 where the oxide semiconductor connects with the drain wiring 17 and with the source wring 18; thus, disappearance of the oxide semiconductor 13 can be avoided. The metal that constitutes the protective layer 50 can be the same metal for the video signal line 92, e.g. the structure that Al alloy is sandwiched by e.g. Ti. The structure of FIG. 16 enables to fabricate a TFT of the oxide semiconductor 13 having a high reliability.

The structures of FIGS. 11 to 16 are combinable. The combination makes the characteristics in the TFT of the oxide semiconductor 13 more reliable.

Fourth Embodiment

Figure 17:
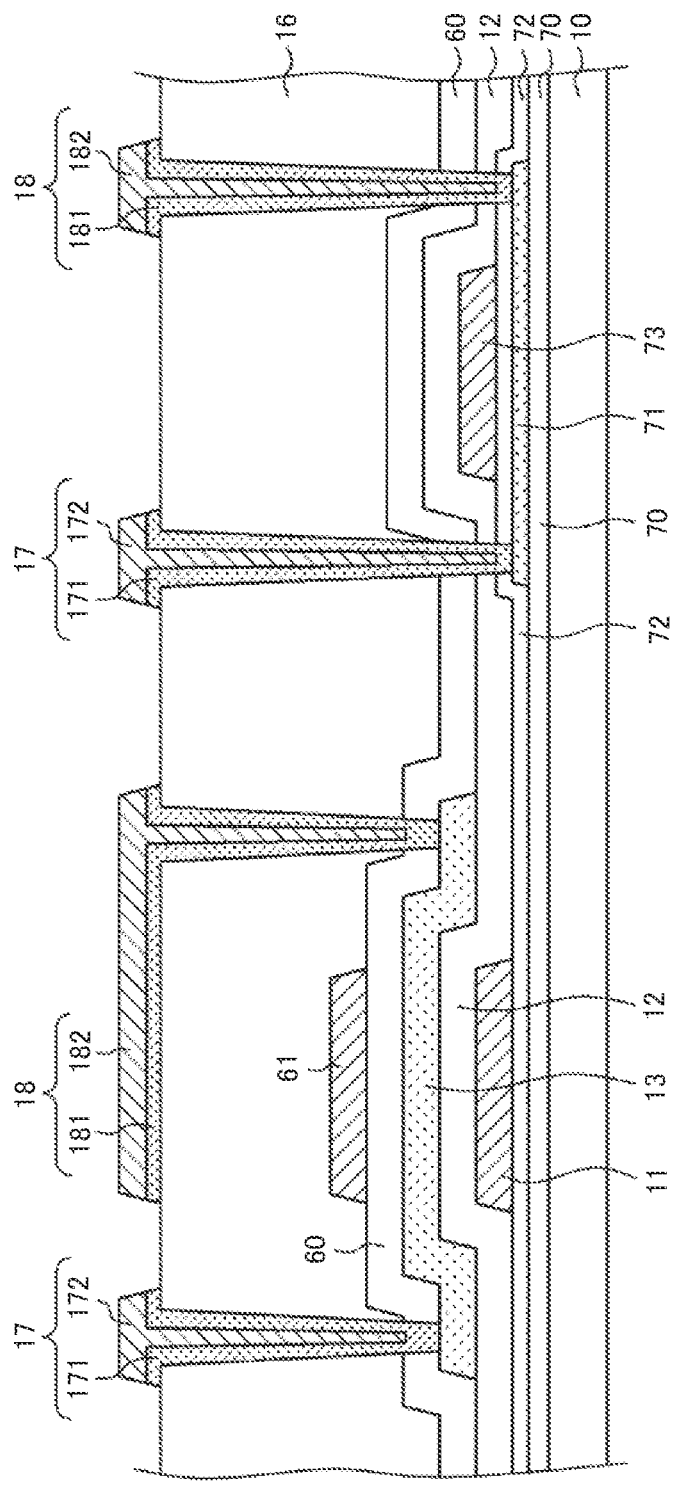
FIG. 17 is a cross sectional view of the fourth embodiment.

FIG. 17 is a cross sectional view of the fourth embodiment. FIG. 17 is a hybrid type structure that includes the dual gate type TFT of the oxide semiconductor and the TFT of the Poly-Si. At the outset, the dual gate type TFT of the oxide semiconductor at the left hand side is explained.

The ON current of the TFT of the oxide semiconductor is 10 times larger than the ON current of the TFT of the a-Si; however, it is not big as the ON current of the TFT of the Poly-Si. The dual gate type can increase the ON current of the TFT of the oxide semiconductor 13.

The figure of the left hand side of FIG. 17 is a cross sectional view of the TFT of dual gate type. In the left hand side TFT of FIG. 17, the undercoat 70 is formed on the TFT substrate 10; the third gate insulating film 72, which is a gate insulating film 72 of the TFT of the Poly-Si is formed on the undercoat 70; the gate electrode 11 is formed on the third gate insulating film 72; the gate insulating film 12 is formed on the gate electrode 11. The first oxide semiconductor 13, which constitutes the TFT, is formed on the gate insulating film 12.

The second gate insulating film 60 is formed on the first oxide semiconductor 13; the second gate electrode 61 is formed on the second gate insulating film 60. The interlayer insulating film 16 is formed covering the second gate electrode 61 and the second gate insulating film 60. Through holes are formed in the interlayer insulating film 16 and the gate insulating film 60 to form the drain wiring 17 and the source wiring 18 in those through holes.

The drain wiring 17 and the source wiring 18 are laminated films of the second oxide semiconductor 171, 181 and the metal 172, 182. The structures and the functions of the drain wiring 17 and the source wiring 18 are the same as explained at FIG. 4 of the first embodiment and at FIG. 11 of the third embodiment. According to the dual gate type TFT of the oxide semiconductor 13 of the present invention, the TFT of high ON current and high reliability can be realized.

The right hand side of FIG. 17 is a cross sectional view of the TFT of the Poly-Si 71. The structure of the TFT of the Poly-Si 71 in FIG. 17 is the same as the TFT of the Poly-Si 71 in FIG. 9. Therefore, the explanation of the Poly-Si TFT is omitted. According to the structure of FIG. 17, the display device having hybrid type TFTs of high reliability formed by the TFT of the oxide semiconductor 13 and the TFT of the Poly-Si 71 can be realized.

Figure 18:
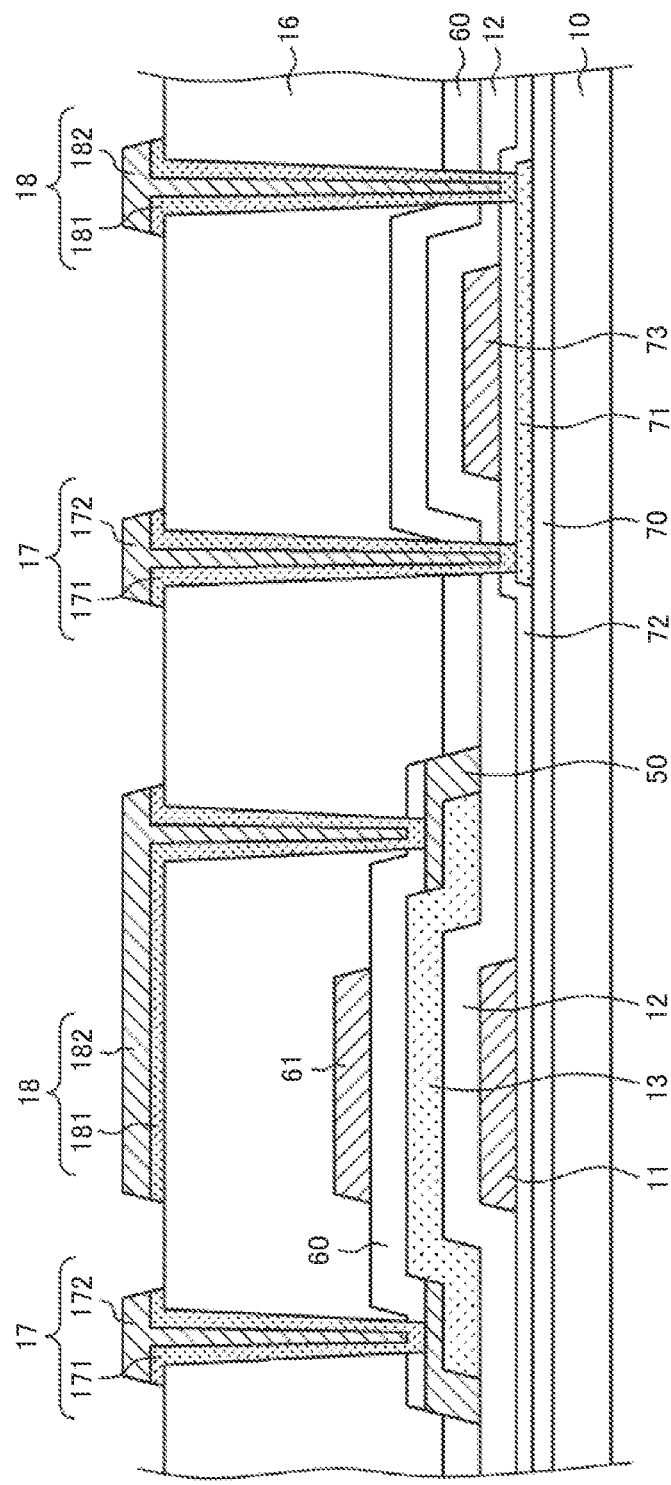
FIG. 18 is a cross sectional view of another example of the fourth embodiment.

FIG. 18 is a cross sectional view of another example according to the current embodiment. FIG. 18 differs from FIG. 17 in that the protective layer 50 made of metal is formed on the first oxide semiconductor 13 at portions the drain wring 17 and the source wiring 18 connect with the first oxide semiconductor 13.

As depicted in FIGS. 17 and 18, the through hole is formed through five layers in the TFT of the Poly-Si while the through hole is formed through three layers in the TFT of the oxide semiconductor. Thus, the oxide semiconductor 13 is exposed to the etching media longer time than the Poly-Si is; consequently, a danger of dissolution of the oxide semiconductor 13 exists.

In addition, in the TFT of the poly-Si, the through holes must be cleaned with hydrofluoric acid HF. At this time, the oxide semiconductor 13 is exposed to the hydrofluoric acid HF, too. The oxide semiconductor 13 is dissolved by the hydrofluoric acid HF easily.

FIG. 18 is a cross sectional view of the hybrid type TFT that overcomes the above explained problem. The structure of FIG. 18 can avoid the problem that the oxide semiconductor is dissolved by the etching solution since the protective layer 50, which is formed by metal, is formed on the oxide semiconductor 13. According to the structure of FIG. 18, the display device having hybrid type TFTs of high reliability formed by the TFT of the oxide semiconductor 13 and the TFT of the Poly-Si 71 can be realized.

Fifth Embodiment

Figure 19:
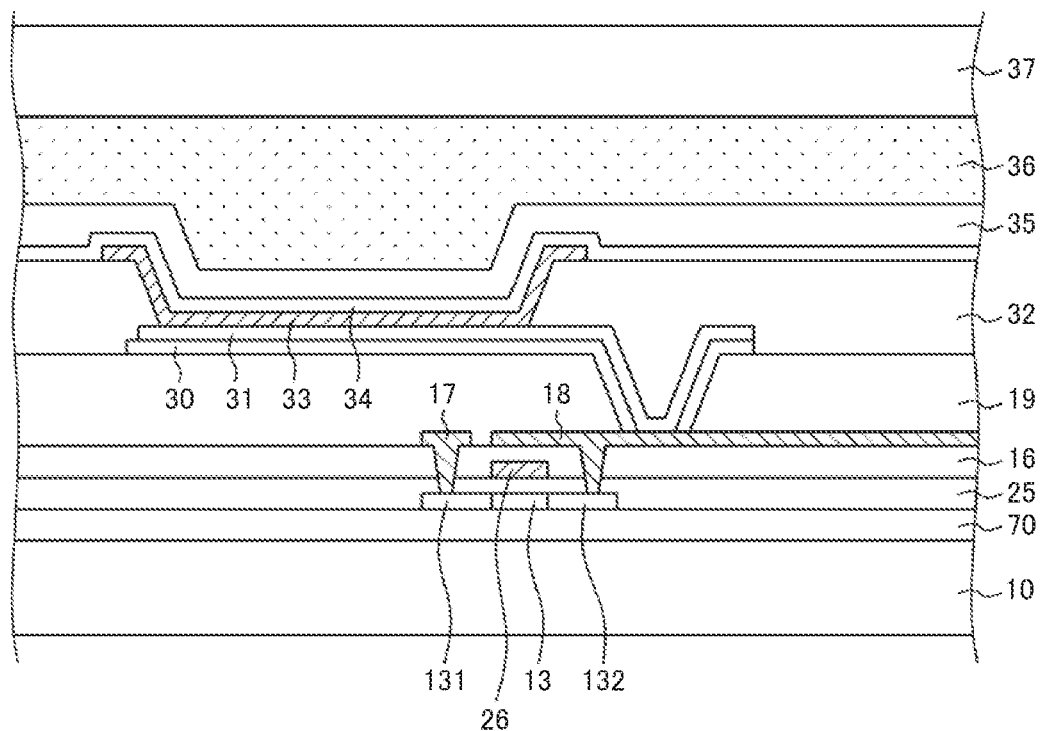
FIG. 19 is a cross sectional view of the display area of the organic EL display device.

The first to fourth embodiments are explained in regard to the liquid crystal display device as depicted in FIGS. 1-3. The present invention is, however, applicable to the organic EL display device as well as to the liquid crystal display device. FIG. 19 is a cross sectional view of the display area of the organic EL display device. In FIG. 19, the following structure is the same as FIG. 10 of the liquid crystal display device; namely, the TFT is formed on the TFT substrate 10; the organic passivation film 19 is formed on the TFT; the through hole is formed in the organic passivation film 19.

Therefore, the structure of the TFT of the oxide semiconductor, explained in the first to fourth embodiments, is applicable to the organic EL display device.

In FIG. 19, the refection electrode 30 is formed on the organic passivation film 19; the oxide conductive film as ITO (Indium Tin Oxide) for the anode 31 is formed on the reflection electrode 30. The bank 32 is formed by e.g. acrylic resin covering the anode 31 and the organic passivation film 19. In the hole of the bank 32, the organic EL layer 33 is formed as a light emitting layer on the anode 31. The organic EL layer 33 is constituted by plural layers; the thickness is about several hundred nm even all the layers are combined, namely, each of the layers is very thin. The bank is formed so that the organic EL layer 33 doesn't have a step disconnection at the edge of the anode 31 or the reflection electrode 30.

In FIG. 19, the upper electrode for a cathode 34, which is made of the oxide conductive film as e.g. ITO or IZO (Indium Zinc Oxide), or a thin metal, is formed over the organic EL layer 33. Since the organic EL layer 33 is decomposed by moisture, the protective film 35, made of e.g. SiN, is formed to prevent the intrusion of moisture.

Since the organic EL display device uses the reflection electrode 30, the external light is reflected, which deteriorates the visibility of the screen. To prevent this phenomenon, the circular polarizing plate 37 is adhered to the screen e.g. via the adhesive 36.

As described above, the structure of the organic EL display device has the same structure as the liquid crystal display device up to formation of the drain wring 17 and the source wiring 18 with the oxide semiconductor 13; thus, the present invention, explained by the first to fourth embodiments, is applicable to the organic EL display device, too.

The invention claimed is:

1. A manufacturing method of a semiconductor device comprising:
   a first process forming an oxide semiconductor above a substrate;
   a second process forming a gate electrode overlapping the oxide semiconductor in a plan view;
   a third process forming an inorganic insulating film between the oxide semiconductor and the gate electrode; and
   a fourth process forming an aluminum oxide film between the oxide semiconductor and the gate electrode,
   wherein the third and fourth processes are performed between the first process and the second process.

2. The manufacturing method of a semiconductor device according claim 1, wherein the first process is performed before the second process.

3. The manufacturing method of a semiconductor device according claim 1, wherein the first process is performed after the second process.

4. The manufacturing method of a semiconductor device according claim 1, wherein the third process is performed before the fourth process.

5. The manufacturing method of a semiconductor device according claim 1, wherein the third process is performed after the fourth process.

6. The manufacturing method of a semiconductor device according claim 1, wherein the inorganic insulating film includes a silicon oxide film or a silicon nitride film.

7. The manufacturing method of a semiconductor device according claim 1, further comprising an undercoat forming process forming an undercoat on the substrate and under the oxide semiconductor and the gate electrode, the undercoat including an aluminum oxide film.

8. The manufacturing method of a semiconductor device according claim 7, wherein the undercoat includes a silicon oxide film or a silicon nitride film.

9. The manufacturing method of a semiconductor device according claim 1, further comprising an interlayer insulating film forming process forming an interlayer insulating film covering the oxide semiconductor and the gate electrode, the interlayer insulating film including an aluminum oxide film.

10. The manufacturing method of a semiconductor device according claim 9, wherein the interlayer insulating film includes a silicon oxide film or a silicon nitride film.

11. A manufacturing method of a semiconductor device comprising:
    an oxide semiconductor forming process forming an oxide semiconductor above a substrate;
    an inorganic insulating film forming process forming an inorganic insulating film on the oxide semiconductor;
    an aluminum oxide film forming process forming an aluminum oxide film on the inorganic insulating film; and
    a gate electrode forming process forming a gate electrode above the oxide semiconductor.

12. The manufacturing method of a semiconductor device according claim 11, wherein the inorganic insulating film includes a silicon oxide film or a silicon nitride film.

13. The manufacturing method of a semiconductor device according claim 11, further comprising an undercoat forming process forming an undercoat on the substrate and under the oxide semiconductor and the gate electrode, the undercoat including an aluminum oxide film.

14. The manufacturing method of a semiconductor device according claim 13, wherein the undercoat includes a silicon oxide film or a silicon nitride film.

15. The manufacturing method of a semiconductor device according claim 11, further comprising an interlayer insulating film forming process forming an interlayer insulating film covering the oxide semiconductor and the gate electrode, the interlayer insulating film including an aluminum oxide film.

16. The manufacturing method of a semiconductor device according claim 15, wherein the interlayer insulating film includes a silicon oxide film or a silicon nitride film.

\* \* \* \* \*